(12) United States Patent
Shin

(10) Patent No.: US 8,670,087 B2
(45) Date of Patent: Mar. 11, 2014

(54) LIGHT EMITTING MODULE AND DISPLAY DEVICE HAVING THE SAME

(71) Applicant: LG Innotek Co., Ltd., Seoul (KR)

(72) Inventor: Kyung Ho Shin, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/897,948

(22) Filed: May 20, 2013

(65) Prior Publication Data

US 2013/0265742 A1 Oct. 10, 2013

Related U.S. Application Data

(63) Continuation of application No. 12/621,444, filed on Nov. 18, 2009, now Pat. No. 8,446,544.

(30) Foreign Application Priority Data

Nov. 18, 2008 (KR) ........................ 10-2008-0114730

(51) Int. Cl.
*G02F 1/1335* (2006.01)
(52) U.S. Cl.
USPC .............. 349/61; 362/231; 362/363; 362/612
(58) Field of Classification Search
None
See application file for complete search history.

(56) References Cited

U.S. PATENT DOCUMENTS

| 8,294,165 B2 | 10/2012 | Hattori et al. |
| 2005/0151147 A1 | 7/2005 | Izuno et al. |
| 2005/0224830 A1 | 10/2005 | Blonder et al. |
| 2006/0097245 A1 | 5/2006 | Aanegola et al. |
| 2006/0105484 A1 | 5/2006 | Basin et al. |
| 2006/0171152 A1 | 8/2006 | Suehiro et al. |
| 2006/0197098 A1 | 9/2006 | Aihara |
| 2007/0159064 A1 | 7/2007 | Choi et al. |
| 2008/0076198 A1 | 3/2008 | Park et al. |
| 2008/0111141 A1 | 5/2008 | Li et al. |
| 2008/0112188 A1 | 5/2008 | Chen et al. |
| 2008/0158480 A1 | 7/2008 | Ii et al. |
| 2008/0180948 A1* | 7/2008 | Yoon et al. .................... 362/230 |
| 2009/0310335 A1 | 12/2009 | Park |

FOREIGN PATENT DOCUMENTS

| CN | 1832167 A | 9/2006 |
| JP | 2004-172578 A | 6/2004 |
| JP | 2007-080880 A | 3/2007 |
| JP | 2007-273562 A | 10/2007 |
| JP | 2007-311663 A | 11/2007 |
| JP | 2008-187212 A | 8/2008 |
| KR | 10-2006-0121445 A | 11/2006 |
| KR | 10-0649704 B1 | 11/2006 |
| KR | 10-0755612 B1 | 9/2007 |
| KR | 10-2007-0115214 A | 12/2007 |
| KR | 10-2008-0092756 A | 10/2008 |

(Continued)

*Primary Examiner* — Richard Kim
(74) *Attorney, Agent, or Firm* — Birch, Stewart, Kolasch & Birch, LLP

(57) ABSTRACT

A light emitting module including a board, a plurality of light emitting devices on the board, a resin disposed on the plurality of light emitting devices, and a phosphor film on the resin and extending along areas between the light emitting devices, wherein the light emitting devices are spaced from each other by a predetermined distance, wherein the phosphor film is divided into parts, the parts having different phosphors being one of a red phosphor, a green phosphor or a blue phosphor and corresponding respectively to the light emitting devices, and wherein the divided phosphor films are connected to each other and makes a continuous phosphor film layer.

20 Claims, 3 Drawing Sheets

(56) References Cited

FOREIGN PATENT DOCUMENTS

| | | |
|---|---|---|
| KR | 10-2008-0093221 A | 10/2008 |
| WO | WO 2007/049187 A1 | 5/2007 |
| WO | WO 2007/088501 A1 | 9/2007 |
| WO | WO 2008/063216 A2 | 5/2008 |
| WO | WO 2008/127064 A1 | 10/2008 |

\* cited by examiner

LIGHT EMITTING MODULE AND DISPLAY DEVICE HAVING THE SAME

CROSS-REFERENCE TO RELATED APPLICATIONS

The present application is a continuation of application Ser. No. 12/621,444, filed Nov. 18, 2009 and which claims priority under 35 U.S.C. 119 to Korean Patent Application No. 10-2008-0114730 filed on Nov. 18, 2008, which are hereby incorporated by reference in their entirety.

BACKGROUND OF THE INVENTION

Embodiments relate to a light emitting module and a display device having the same.

With the development of the electronic device industry, a variety of display devices that are small-sized and have relatively low energy consumption have been developed. One of the display devices is a liquid crystal display (LCD) device that has been widely used as a display unit for a monitor, a television, and a mobile communication terminal.

Since the LCD device is not a self-luminous device, a backlight unit used as a light source for emitting light toward a rear surface of an LCD panel is provided generally. The backlight unit emits white light so that the liquid crystal panel can reproduce the real colors of the image.

SUMMARY OF THE INVENTION

Embodiments provide a light emitting module including a phosphor film attached to a light emitting device array, and a display device having the same.

Embodiments provide a light emitting module in which a phosphor film is attached to a plurality of light emitting devices that emit light of the same color or different colors to realize a target light emitting device, and a display device having the same.

An embodiment provides a light emitting module comprising: a board; a plurality of light emitting devices on the board; and a phosphor film contacting on the board and the light emitting devices.

Embodiments provide a light emitting module, display device including the light emitting module, and method of forming the same, which address the limitations and disadvantages associated with the related art.

An embodiment provides a display device comprising: a light emitting device comprising a board, a plurality of light emitting devices on the board, light transmitting resins, and a phosphor film contacting on the board and the light transmitting resins; an optical member spaced from the light emitting devices; and a display panel on the optical member.

According to an embodiment, the invention provides a light emitting module comprising: a board; a plurality of light emitting devices on the board; and a phosphor film covering the light emitting devices and covering and extending along areas between the light emitting devices.

According to an embodiment, the invention provides a display device comprising: a light emitting module comprising a board, a plurality of light emitting devices on the board, and a phosphor film covering the light emitting devices and covering and extending along areas between the light emitting devices; an optical member spaced apart from the light emitting module; and a display panel on the optical member.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the thickness of the each layer will also be described as an example and is not limited to the thickness of the accompanying drawings.

Figure 1:
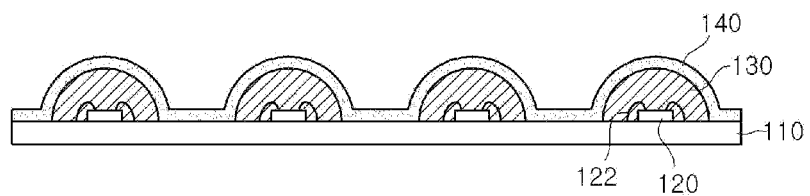
FIG. 1 is a side cross-sectional view illustrating a light emitting module according to a first embodiment of the invention.

FIG. 1 is a side cross-sectional view illustrating a light emitting module according to a first embodiment.

Referring to FIG. 1, a light emitting module 100 includes a board 110, a light emitting device 120, a light transmitting resin or layer 130, and a phosphor film or layer 140. The light emitting module 100 may be defined as a single light emitting apparatus. All the components of the light emitting module 100 are operatively coupled and configured.

The board 110 may selectively include a single layer printed circuit board (PCB), a multi-layer PCB, a ceramic PCB, and a metal PCB. A line pattern or a coated electrode pattern, which has a predetermined pattern shape to supply a power source, may be disposed on the board 110. Hereinafter, for convenience of description, the line pattern will be described as one example of the pattern for supplying the power source. However, the invention covers other patterns.

A plurality of light emitting devices 120 are mounted or provided on the board 110. The light emitting devices 120 may be mounted on the board 110 in a chip of board (COB) type or a package of board (POB) type. Hereinafter, for convenience of description, a structure in which the light emitting device 120 is mounted on the board 110 in the COB type will be described as an example. However, the invention covers other types.

A top or upper surface of the board 110 may have a flat plane shape, or a plurality of cavities may be formed in the top surface of the board 110. At least one light emitting device 120 and the light transmitting resin 130 may be disposed inside the cavities of the board 110. In examples, a single light emitting device 120 or multiple light emitting devices 120 may be disposed in each of the cavities of the board 110. The cavities can be in any shape or size. In another variation, projections may be provided on the board 110 and the light emitting devices 120 may be disposed on these projections.

The plurality of light emitting devices 120 may be arranged on the board 110 in a transverse direction and/or in a longitudinal direction to form an array structure. Alternatively, the plurality of light emitting devices 120 may be arranged in a matrix or zigzag shape, or in other suitable shapes or patterns.

The plurality of light emitting devices 120 may be arranged spaced from each other by a predetermined distance, but is not limited thereto. A reflective material may be coated on a region of the board 110 excluding a region, in which the light emitting device 120 is disposed, to reflect incident light.

Each light emitting device 120 may be electrically connected to the line pattern (not shown) formed on the board 110 using a wire 122. In the present embodiment, each light emitting device 120 may be electrically connected using a single wire or multiple wires. The light emitting devices 120 may be mounted by selectively using a wire bonding method, a flip chip method, or a die bonding method. Such a connection method of the light emitting device 120 may be changed according to a chip kind and a mounting method, but the invention is not limited thereto.

The plurality of light emitting devices 120 may be connected to each other in series or parallel. Such a connection method may be changed according to a circuit pattern and a driving method.

Each light emitting device 120 may include one of a blue LED chip, a green LED chip, a red LED chip, and an ultraviolet (UV) LED chip. For convenience of description, in the first embodiment, the light emitting device having the blue LED chip that emits blue light will be described below as one non-limiting example.

The light transmitting resin 130 is disposed on the light emitting devices 120. The light transmitting resin 130 may include a transparent resin formed of silicon or epoxy. The light transmitting resin 130 may have a hemisphere shape or a convex lens shape, e.g., for covering the light emitting device(s) 120. The shape of the light transmitting resin 130 may be variously modified according to light efficiency and light distribution.

The light transmitting resin 130 may seal at least one light emitting device 120. For example, the light transmitting resin 130 may seal one light emitting device 120 or two or more light emitting devices 120 at a time. The sealed shape may be a hemisphere shape or a convex lens (including a total reflection lens, etc.) shape. In another example, the light transmitting resin 130 may also be a planarized/flat layer covering the light emitting devices 120, or can be in the hemisphere or convex lens shape directly over each light emitting device 120 with the resin 130 covering and connecting areas between the hemisphere/convex lens shaped resin 130.

The phosphor film 140 is disposed on the light transmitting resins 130. The phosphor film 140 may be curved along a surface of the light transmitting resin 130 and may be tightly attached or adhered to the surface of the light transmitting resin 130.

The phosphor film 140 is attached along or in contact with top surfaces of the board 110 between the curved shaped portions of the light transmitting resin 130 over the light emitting devices 120. For instance, the phosphor film 140 can preferably cover the entire exposed surfaces of the light transmitting resin 130 and/or the entire exposed surfaces of the board 110. The phosphor film 140 may include a transparent film formed of a mixture of a polymer such as silicon or epoxy and a phosphor. The phosphor may include at least one phosphor of a yellow phosphor, a red phosphor, a blue phosphor, and a green phosphor. Hereinafter, in the first embodiment, the phosphor film 140 containing the yellow phosphor will be described as an example.

According to the light emitting module 100, a light emitting device array on the board 110 is sealed by the light transmitting resin 130. Then, the phosphor film 140 is stacked on the entire surface of the board 110 to adhere thereto. In case of the POB type, the light transmitting resin 130 may have a predetermined lens shape.

The light emitting module 100 emits light of a first color from one of the light emitting devices 120. The light of the first color emitted from the light emitting device 120 is emitted through the light transmitting resin 130. The light of the first color enters the phosphor film 140. In this case, a portion of the light of the first color is absorbed into the phosphor in the phosphor film 140, and then, is emitted as light of a second color. The light of the first color and the light of the second color are mixed to produce light of a third color that is target light, thereby emitting the light of the third color.

For example, when the light of the first color is blue light generated by the blue LED chip in one particular light emitting device 10, and the light of the second color is yellow light generated by the yellow phosphor in the phosphor film 140, the light of the third color emerging from the phosphor film 140 above the particular light emitting device 10 may be white light. To emit the target light of a desired color, the phosphor film 140 may be changed within the above-described technical scope.

In the light emitting module 100, since the light emitting device 120 is spaced a predetermined distance from the phosphor film 140, it may prevent the phosphor of the phosphor film 140 from being degraded or discolored. Also, since the phosphor film 140 is closely attached to the light transmitting resin 130 with preferably a uniform distribution and the same thickness, target light having a uniform color degree may be emitted.

Also, since the light emitted from the light emitting device 120 is diffused by the light transmitting resin 130 to pass through the entire region of the phosphor film 140 covering the light transmitting resin 130, uniformly distributed light is emitted from the phosphor film 140.

FIGS. 2 to 6 are views illustrating a process of manufacturing the light emitting module according to the first embodiment.

Figure 2:
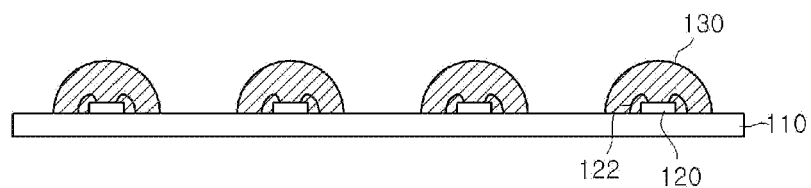
FIGS. 2 to 6 are views illustrating a process of manufacturing the light emitting module according to the first embodiment.

Referring to FIG. 2, a plurality of light emitting devices 120 are mounted on a board 110.

The board 110 may selectively include a single layer PCB, a multilayer PCB, a ceramic PCB, and/or a metal PCB. A line pattern) or a coated electrode pattern, each having a predetermined pattern shape to supply a power source, may be disposed on the board 110. Hereinafter, for convenience of description, the line pattern will be described as the pattern for supplying the power source as an example.

The plurality of light emitting devices 120 are mounted on the board 110. The light emitting devices 120 may be mounted on the board 110 in a COB type or a POB type. Hereinafter, for convenience of description, a structure in which the light emitting device 120 is mounted on the board 110 in the COB type will be described as an example.

The plurality of light emitting devices 120 may be arranged on the board 110 in a transverse direction and/or in a longitudinal direction to form an array structure. Alternatively, the plurality of light emitting devices 120 may be arranged in a matrix or zigzag shape.

A top surface of the board 110 may have a flat plane shape, or a plurality of grooves may be formed in or on the top surface of the board 110. At least one light emitting device 120 may be disposed inside the grooves or a cavity of the board 110.

Each light emitting device 120 is attached to the line pattern of the board 110 and is electrically connected to the line pattern formed on the board 110 using a wire 122. The light emitting device 120 may be mounted by selectively using at least one method of a wire bonding method, a flip bonding method, and a die bonding method.

Each light emitting device 120 may include one of colored LED chips such as a blue LED chip, a green LED chip, and a red LED chip, or a UV LED chip. The LED chip may be modified according to target light to be output.

A light transmitting resin 130 is formed on the light emitting device 120. The light transmitting resin 130 may include a transparent resin formed of silicon or epoxy. The light transmitting resin 130 may have a hemisphere shape or a convex lens shape (including a total-reflection lens, etc.). The shape of the light transmitting resin 130 may be variously modified according to desired light distribution and light quantity.

The light transmitting resin 130 may seal one light emitting device 120 or two or more light emitting devices 120 of the same group.

Figure 3:
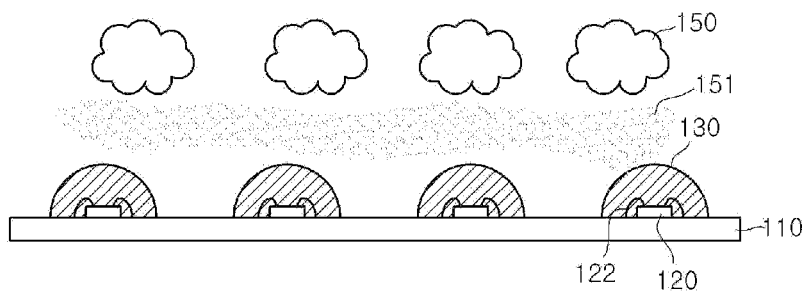

Referring to FIG. 3, an adhesive 151 is sprayed onto the board 110 using a spraying equipment (e.g., sprayer) 150 or can be applied onto the board 110 in some other manner. The adhesive 151 is preferably formed of a polymer such as silicon or epoxy. The adhesive 151 may be uniformly coated on the surfaces of the board 110 and the light transmitting resin 130 using the spraying equipment 150.

The adhesive 151 is coated on the entire surface of the board 110 having the light transmitting resin 130. For example, the adhesive 151 is coated on the surfaces of the light transmitting resin 130 and the board 110.

Figure 4:
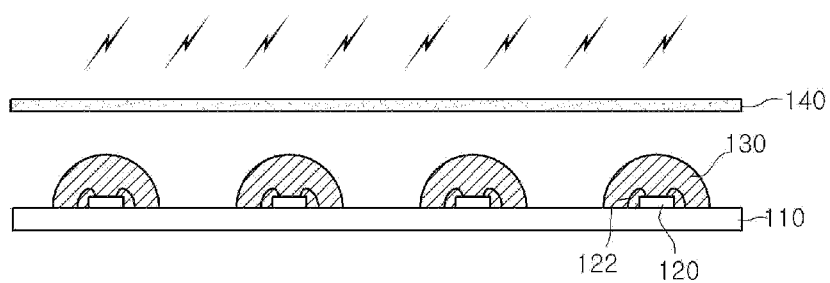

Referring to FIG. 4, a phosphor film 140 is disposed on the board 110. The phosphor film 140 is heated by irradiating preferably uniform heat using a heating equipment to form the flexible phosphor film 140. The heating process may be variously performed according to a mother material of the phosphor film 140. For example, the heating process may be performed at a temperature of about 50° C. to about 200° C.

At least one phosphor, e.g., a yellow phosphor, a red phosphor, a blue phosphor, and/or a green phosphor may be selectively added to the phosphor film 140. Hereinafter, in the first embodiment, the phosphor film 140 containing the yellow phosphor will be described as an example.

Figure 5:
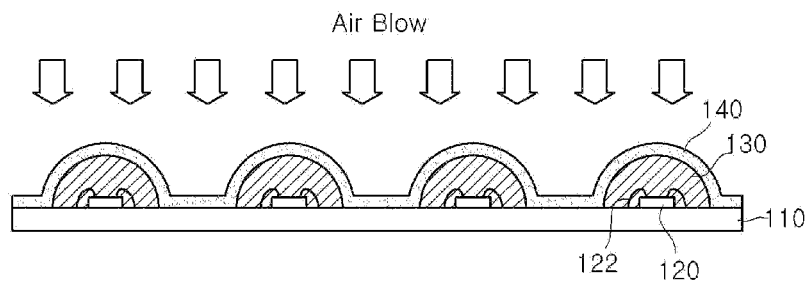

Referring to FIG. 5, the flexible phosphor film 140 is closely attached to the board 110. At this time, the phosphor film 140 is closely attached to the board 110 using an air blow equipment. The phosphor film 140 may be closely attached to the surfaces of the board 110 and the light transmitting resin 130 using a separate compressing unit.

The phosphor film 140 is curved along the surface of the light transmitting resin 130 on the board 110 and adheres thereto. The phosphor film 140 is closely attached preferably with a uniform thickness, but may have a varying thickness. The phosphor film 140 is closely attached to the surfaces of the board 110 and the light transmitting resin 130.

Figure 6:
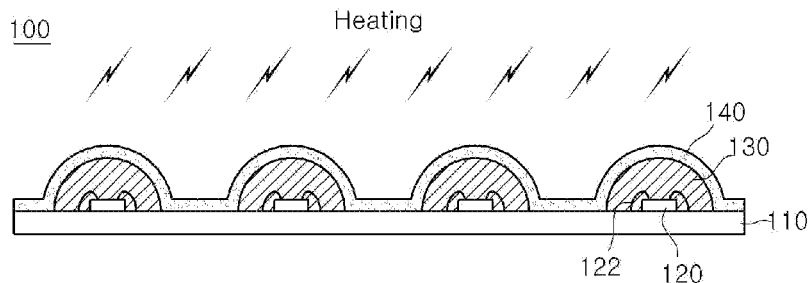

Referring to FIG. 6, a top surface of the board 110 including the phosphor film 140 is heated using the heating equipment to harden the top surface of the board 110. At this time, the phosphor film 140 is hardened while the closely attached phosphor film 140 is heated to more completely be attached to the surfaces of the board 110 and the light transmitting resin 130. In the hardening process, a hardened condition may be changed according to the mother material of the phosphor film 140.

Since the phosphor film 140 is closely attached to the light transmitting resin 130 with the uniform thickness, a target light having a uniform color degree is secured by the light emitting module 100 according to the invention.

In the light emitting module 100, the light emitting device 120 arranged in an array form on the board 100 is protected by the light transmitting resin 130. Then, the phosphor film 400 is closely attached to the surface of the board 110 to simply manufacture the light emitting module 100. Therefore, discoloration of the phosphor is prevented or minimized to improve reliability.

Figure 7:
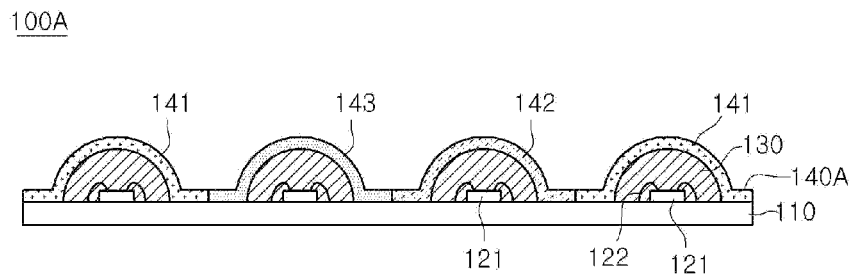
FIG. 7 is a side cross-sectional view illustrating a light emitting module according to a second embodiment of the invention.

FIG. 7 is a side cross-sectional view illustrating a light emitting module according to a second embodiment. In description of the second embodiment, parts having the same structure as the first embodiment will be generally identified using the same reference numbers and described with reference to the first embodiment, and some of their duplicated description will be omitted for the sake of brevity.

Referring to FIG. 7, a light emitting module 100A includes a board 110, a plurality of light emitting devices 121, a plurality of light transmitting resins 130, and a phosphor film 140A divided into a plurality of phosphor parts 141, 142, and 143. All the components of the light emitting module 100A are operatively coupled and configured.

Each of the light emitting devices 121 may include a UV LED chip disposed in a chip or package type. The light emitting device 121 can be identical to the light emitting devices 120.

At least two or more different phosphors are separately provided into regions and disposed to form the phosphor film 140A. Hereinafter, for convenience of description, a case in which three kinds of phosphors are disposed as part of the phosphor film 140A will be described as an example. However, the invention covers a phosphor film 140A having any number of different phosphor parts, which may be arranged repeatedly in a certain sequence or which may be arranged in a certain pattern.

As part of the phosphor film 140A, one cycle of a first phosphor part 141, a second phosphor part 142, and a third phosphor part 143 is repeatedly arrayed over the board 110 having the resin 130. Here, the third phosphor part 143 may be disposed between the first phosphor part 141 and the second phosphor part 142 with a distance corresponding to that of at least two light emitting devices 121 therebetween.

An array direction of the first to third phosphor parts 141, 142, and 143 may be disposed in a transverse direction and/or in a longitudinal direction, but is not limited to the array direction.

The plurality of light emitting devices 121 may be spaced a predetermined distance apart from each other, and a distance between a start portion of the first phosphor part 141 and a start portion of the third phosphor part 143 may correspond to the distance between the corresponding light emitting devices 121.

When the phosphor film 140A is adhered to the light transmitting resin 130, the first to third phosphor parts 141, 142, and 143 are closely attached and adhered to each of the portions of the light transmitting resin 130 covering the light emitting devices 121.

When the light emitting device 121 includes a UV LED chip, the first phosphor part 141, the second phosphor part 142, and the third phosphor part 143 of the phosphor film 140A may be classified into a blue phosphor region, a green phosphor region, and a red phosphor region, respectively, but is not limited to this order of the phosphors.

Phosphor particles that are equal to or different from each other may be added to the first to third phosphor parts 141, 142, and 143 of the phosphor film 140. An addition rate may be varied within the technical scope of the embodiment(s) according to light distribution and light density.

Here, each of the first to third phosphor parts 141, 142, and 143 may extend for a distance corresponding to a region covering each light emitting device 121, and the number and cycle of phosphor parts may be changed.

In the light emitting module 100A, when UV light is emitted through the light emitting device 121, the UV light is mixed with the light emitted from each of the phosphor parts 141, 142, and 143 of the phosphor film 140A to produce white light.

Alternatively, the phosphor film 104A may include four phosphor regions, e.g., regions of a red phosphor part, a green phosphor part, a blue phosphor part, and a yellow phosphor part. The red phosphor part, the green phosphor part, and the blue phosphor part may be disposed in a region of a UV LED chip, and the yellow phosphor part may be disposed in a region of a blue LED chip. The blue LED chip and the yellow phosphor part may be disposed at predetermined positions, respectively. The positions may be variously changed within the technical scope of the embodiments.

Figure 8:
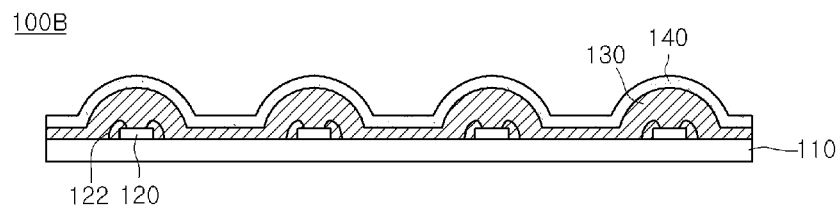
FIG. 8 is a side cross-sectional view illustrating a light emitting module according to a third embodiment of the invention.

FIG. 8 is a side cross-sectional view illustrating a light emitting module according to a third embodiment of the invention.

Referring to FIG. 8, the light emitting module 100B is preferably identical to the light emitting module 100, but differs from the light emitting module 100 in that the light emitting resin 130 covers the light emitting devices 120 and also extends along the areas between the light emitting devices 120. The phosphor film 140 is formed directly on the light emitting resin 130, and covers the light emitting devices 120 and extends along the areas between the light emitting devices 120.

Figure 9:
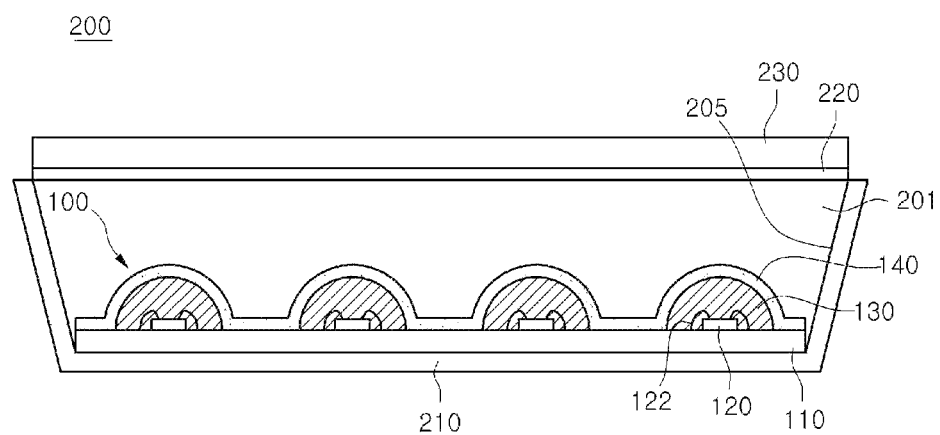
FIG. 9 is a side cross-sectional view illustrating a display device according to an embodiment of the invention.

FIG. 9 is a side cross-sectional view illustrating a display device according to an embodiment.

Referring to FIG. 9, a display device 200 includes a bottom cover 210, a light emitting module 100, an optical sheet 220, and a display panel 230. All the components of the display device 200 are operatively coupled and configured.

The bottom cover 210 may have a container shape, and an inside surface of the bottom cover 210 may be inclined or vertically disposed. Here, a reflective material (e.g., silver (Ag)) may be coated, or a reflective sheet may be adhered to the inside surface.

The bottom cover 210 may have a container shape, and an inside surface of the bottom cover 210 may be inclined or vertically disposed. Here, a reflective material (e.g., silver (Ag)) may be coated, or a reflective sheet may be adhered to the inside surface.

An upper cavity or space 201 having a predetermined depth may be defined in the bottom cover 210, but is not limited thereto.

At least one light emitting module 100 may be coupled to the upper cavity 201 of the bottom cover 210. The light emitting module 100 may be arranged in one or more lines and/or one or more rows, but is not limited thereto.

The light emitting module 100 includes a board 110, a light emitting device 120, a light transmitting resin 130, and a phosphor film 140, as discussed above with reference to the first embodiment.

Since a portion of first light emitted from the light emitting device 120 is converted into second light by the phosphor film 140, target light mixing the first light with the second light may be irradiated from the phosphor film 140.

At least one optical sheet 220 is disposed on the light emitting module 100. The optical sheet 220 may be spaced a predetermined distance from the light emitting module 100. The optical sheet 220 may be supported by a guide pin. The optical sheet 220 may include a diffusion sheet and/or a prism sheet. The diffusion sheet diffuses the light emitted from the light emitting device 120, and the diffused light is guided to a light emitting region by the prism sheet. Here, the prism sheet may include a horizontal and/or vertical prism sheet and one or more luminance enhancement films.

A display panel (e.g., LCD panel) 230 is disposed on the optical sheet 220 to display images using the light emitted from the optical sheet 230. The display panel 230 further includes known components of a display panel such as thin film transistor arrays, color filters, etc. Moreover, the display device 200 can include other known components.

In another variation of FIG. 9, the display device 200 can include the light emitting module 100A or 100B instead of the light emitting module 100.

According to the embodiments, the LED (e.g., LED chips of the light emitting devices 120) can be spaced a predetermined distance from the phosphor to prevent the phosphor from being discolored.

According to the embodiments, the target color having the uniform color degree can be emitted.

According to the embodiments, the white light emitting module can be easily manufactured.

According to the embodiments, the reliability of the light emitting module using the light emitting devices can be improved.

According to the embodiments, the target light using the plurality of light emitting devices and the phosphor film can be realized.

According to the embodiments, the light emitting module can be used as a light source of a lighting module, a display device, or an indication device using the plurality of light emitting devices and the phosphor film.

According to the embodiments, the light emitting module can be applied to a backlight unit including the plurality of light emitting devices and the phosphor film, where the backlight unit can be used in a display device or in other suitable device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
   a board;
   a plurality of light emitting devices on the board;
   a resin disposed on the plurality of light emitting devices; and
   a phosphor film on the resin and extending along areas between the light emitting devices,
   wherein the light emitting devices are spaced from each other by a predetermined distance,
   wherein the phosphor film is divided into parts, the parts having different phosphors being one of a red phosphor, a green phosphor or a blue phosphor and corresponding respectively to the light emitting devices, and
   wherein the divided phosphor films are connected to each other and make a continuous phosphor film layer.

2. The light emitting module according to claim 1, wherein the phosphor film is spaced from the plurality of light emitting devices.

3. The light emitting module according to claim 1, wherein the phosphor film is directly in contact with both a surface of the resin and a top surface of the board between the plurality of light emitting devices.

4. The light emitting module according to claim 1, wherein the phosphor film is directly in contact with an exposed portion of the board which is not covered by the resin.

5. The light emitting module according to claim 1, wherein a bottom surface of the phosphor film is flush with a top surface of the board.

6. The light emitting module according to claim 1, wherein the phosphor film comprises a bridge portion which connects adjacent phosphor film parts, and wherein the bridge portion contacts a top surface of the board.

7. The light emitting module according to claim 1, wherein the phosphor film comprises a bridge portion which connects adjacent phosphor film parts, and wherein the bridge portion is flush with a top surface of the board which is exposed through the resin.

8. The light emitting module according to claim 1, wherein the phosphor film is directly in contact with entire exposed portions of the board, which are not covered by the resin.

9. The light emitting module according to claim 1, wherein the phosphor film is formed in one of a dome shape, a hemisphere shape, and a lens shape on the light emitting devices.

10. The light emitting module according to claim 1, wherein the phosphor film is adhered to the board and the light emitting devices with a uniform thickness.

11. The light emitting module according to claim 1, wherein each of the light emitting devices comprises at least one light emitting diode (LED).

12. The light emitting module according to claim 1, wherein at least one of the light emitting devices emits blue light, and the phosphor film comprises a yellow phosphor.

13. The light emitting module according to claim 1, wherein each of the light emitting devices is one of a chip or package type.

14. The light emitting module according to claim 1, wherein the light emitting devices comprise at least one of a blue LED, a green LED, a red LED, and an ultraviolet (UV) LED, and the phosphor film comprises at least one of a blue phosphor, a green phosphor, a red phosphor, and a yellow phosphor.

15. The light emitting module according to claim 1, wherein the light emitting devices comprise an ultraviolet (UV) LED and a blue LED, which emit light of colors different from each other.

16. The light emitting module according to claim 1, wherein the board comprises a plurality of cavities, and the light emitting devices are disposed inside the cavities, respectively.

17. The light emitting module according to claim 1, wherein the phosphor film comprises a first part adhering to the light emitting device and a second part adhering to the board, and the first and second parts have thicknesses different from each other.

18. The light emitting module according to claim 1, further comprising a reflective material on a region of the board excluding a region where the plurality of light emitting devices are disposed.

19. The light emitting module according to claim 1, wherein the resin extends along the areas between the light emitting devices and is in contact with portions of the board.

20. A display device comprising:
the light emitting module according to the claim 1;
an optical member spaced apart from the light emitting module; and
a display panel on the optical member.

* * * * *